United States Patent
Ashikaga (10) Patent No.: US 7,232,693 B2
(45) Date of Patent: Jun. 19, 2007

(54) METHOD FOR MANUFACTURING FERROELECTRIC MEMORY

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/102,809

(22) Filed: Apr. 11, 2005

(65) Prior Publication Data

US 2006/0046314 A1 Mar. 2, 2006

(30) Foreign Application Priority Data

Aug. 24, 2004 (JP) .............................. 2004-243521

(51) Int. Cl.
*H01L 21/00* (2006.01)
*H01L 21/8242* (2006.01)
*H01L 21/20* (2006.01)

(52) U.S. Cl. .................... 438/3; 438/238; 438/239; 438/240; 438/396; 257/E21.664

(58) Field of Classification Search ............... 438/3, 438/238, 239, 240, 381, 396; 257/E21.664, 257/E21.009
See application file for complete search history.

(56) References Cited

U.S. PATENT DOCUMENTS

| | | | |
|---|---|---|---|
| 5,374,578 A | 12/1994 | Patel et al. | |
| 5,525,528 A | 6/1996 | Perino et al. | |
| 6,010,927 A * | 1/2000 | Jones et al. | 438/210 |
| 6,100,201 A | 8/2000 | Maejima et al. | |
| 6,165,802 A * | 12/2000 | Cuchiaro et al. | 438/3 |
| 6,333,529 B1 * | 12/2001 | Ashida et al. | 257/295 |
| 6,455,882 B1 * | 9/2002 | Nakura | 257/295 |
| 6,885,570 B2 * | 4/2005 | Wouters et al. | 365/49 |
| 6,900,062 B2 * | 5/2005 | Miura | 438/3 |
| 6,953,950 B2 * | 10/2005 | Sashida | 257/69 |
| 2001/0013614 A1 * | 8/2001 | Joshi et al. | 257/295 |
| 2003/0203511 A1 | 10/2003 | Ashikaga | |
| 2004/0113189 A1 * | 6/2004 | Takamatsu et al. | 257/295 |

FOREIGN PATENT DOCUMENTS

| | | |
|---|---|---|
| JP | 6-13565 | 1/1994 |
| JP | 8-8409 | 1/1996 |
| JP | 10-247724 | 9/1998 |
| JP | 2003-324186 | 11/2003 |

* cited by examiner

*Primary Examiner*—B. William Baumeister
*Assistant Examiner*—Igwe U. Anya
(74) *Attorney, Agent, or Firm*—Volentine & Whitt, P.L.L.C.

(57) ABSTRACT

A semiconductor substrate formed with a MOSFET is prepared, and a first interlayer insulating film is deposited on the semiconductor substrate. A ferroelectric capacitor is formed on the first interlayer insulating film. Next, a second interlayer insulating film is formed on a first structure provided with the semiconductor substrate, the first interlayer insulating film and the ferroelectric capacitor so as to embed the ferroelectric capacitor therein. Openings for electrically connecting the MOSFET and the ferroelectric capacitor and an external circuit of a ferroelectric memory are formed in the second interlayer insulating film to form a second structure. A metal wiring is formed on the second interlayer insulating film to form a third structure. Next, the third structure is heat-treated in an atmosphere from over 350° C. to under 450° C.

3 Claims, 5 Drawing Sheets

METHOD FOR MANUFACTURING FERROELECTRIC MEMORY

BACKGROUND OF THE INVENTION

1. Field of the Invention

The present invention relates to a ferroelectric memory, and particularly to a method for manufacturing a non-volatile memory using a ferroelectric capacitor.

2. Description of the Related Art

In recent years, attention has been given to a semiconductor memory (ferroelectric memory) using a ferroelectric capacitor, as a non-volatile memory. A ferroelectric has the property of holding polarization in the direction of voltage application even though the voltage is eliminated (it has spontaneous polarization). Therefore, the ferroelectric memory can be used as the non-volatile memory. Also the reverse speed of polarization of the ferroelectric is on the order of nanoseconds. Further, the voltage necessary for polarization inversion is also restricted to about 2.0V by optimization of a method for manufacturing a ferroelectric thin film. Due to these reasons, the ferroelectric memory is remarkably excellent in rewriting speed and operating voltage as compared with other non-volatile memories such as a flash memory, an EEPROM (Electrically Erasable Programmable Read-Only Memory), etc. Further, since the number of times that data stored in a ferroelectric memory is rewritable or reprogrammable, is greater than or equal to $10^{12}$ times, the ferroelectric memory is now placed on practical use as a RAM (Random Access Memory).

In order to ensure long-term reliability, the ferroelectric memory needs to hold degradation produced due to an imprint to the minimum. The imprint means a phenomenon in which when data is being stored or held in the ferroelectric memory over a long period after writing of the data into the ferroelectric memory, the property of holding data opposite to the held data is degraded. This imprint occurs because when given data is retained, an internal electric field in the same direction as polarization occurs due to redistribution of floating charges lying inside a capacitor.

Since the imprint is relevant to the existence of floating charges lying inside the ferroelectric thin film of the ferroelectric capacitor, it depends on the floating charges that exist in the ferroelectric thin film. In addition to it, the imprint greatly depends on degeneration (damage) of crystalline suffered due to hydrogen or the like introduced into the ferroelectric thin film in a manufacturing process subsequent to the formation of the ferroelectric capacitor. Thus, in order to form the ferroelectric memory, there is a need to provide such a process as not to damage the ferroelectric thin film in the process subsequent to the formation of the ferroelectric capacitor.

As one example therefor, for example, a method for providing a cover film such as $Al_2O_3$ immediately after the formation of a ferroelectric capacitor and preventing the occurrence of damage so as not to allow hydrogen or the like to reach a ferroelectric thin film has already been executed. However, the method using the cover film becomes complex in process even in the case where consideration is made from the viewpoint that another film called "cover film" which is not required originally, is added.

As another example, recovery anneal for improving a ferroelectric characteristic of a ferroelectric capacitor has also been carried out. After the formation of the ferroelectric capacitor, a contact hole is provided by etching to make contact with its corresponding electrode of the ferroelectric capacitor. Since the ferroelectric capacitor is damaged by hydrogen or the like produced upon execution of the etching and formation of an interlayer insulating film by an oxide film, recovery anneal for recovering the damage is carried out in an oxygen atmosphere, for example (see Japanese Unexamined Patent Publication No. Hei 10(1998)-247724). In addition to anneal in the oxygen atmosphere, such recovery anneal was carried out in an ozone atmosphere (see Japanese Unexamined Patent Publication No. Hei 6(1994)-13565), in a nitrogen atmosphere (see Japanese Unexamined Patent Publication No. Hei 8(1996)-8409) or in an atmosphere of air (see Japanese Unexamined Patent Publication No. 2003-324186).

Japanese Unexamined Patent Publication No. Hei 10(1998)-247724 discloses that anneal at 550° C. is further done in an oxygen atmosphere to recover damage generated after the recovery anneal.

Since, however, oxidation of tungsten and aluminum occurs after the formation of a conductor plug formed of tungsten (W) or the like and a metal wring formed of aluminum (Al) or the like, for electrically connecting a MOSFET and a ferroelectric capacitor, and an external circuit, it is difficult to carry out anneal in an oxygen atmosphere at a high temperature.

SUMMARY OF THE INVENTION

The present invention has been made in view of the above problems. It is therefore an object of the present invention to provide a ferroelectric memory, particularly, a method for manufacturing a non-volatile memory using a ferroelectric capacitor, which suppresses damage suffered in a step subsequent to the formation of the ferroelectric capacitor.

In order to attain the above object, there is provided a method for manufacturing a ferroelectric memory, according to the present invention, which comprises the following steps. A semiconductor substrate formed with a MOSFET is first prepared and a first interlayer insulating film is deposited on the semiconductor substrate. Next, a first conductor layer, a ferroelectric layer and a second conductor layer are sequentially laminated over the first interlayer insulating film to form a capacitor forming laminated film. Next, the second conductor layer is processed to form an upper electrode and further the ferroelectric layer and the first conductor layer are sequentially processed to form a ferroelectric thin film and a lower electrode respectively, thereby forming a ferroelectric capacitor from the capacitor forming laminated film.

Next, a second interlayer insulating film is formed on a first structure provided with the semiconductor substrate, the first interlayer insulating film and the ferroelectric capacitor so as to embed the ferroelectric capacitor therein. Openings for electrically connecting the MOSFET and the ferroelectric capacitor and an external circuit of the ferroelectric memory are formed in the second interlayer insulating film to form a second structure. Thereafter, a metal wiring is formed on the second interlayer insulating film of the second structure to form a third structure. Next, the third structure is thermally treated in an atmosphere from over 350° C. to under 450° C.

According to the method for manufacturing the ferroelectric memory, of the present invention, thermal treatment is done in the atmosphere at 350° C. to 450° C. of such a degree as not to influence the metal wiring formed of aluminum after the formation of the metal wiring on the second interlayer insulating film. With such thermal treatment, damage species such as hydrogen, fluorine, chloride and water or the like are released from the second interlayer insulating film. Accordingly, the damage species that reach the ferroelectric thin film due to a thermal load subsequent to the step for forming the metal wiring, are reduced drastically so that degradation due to an imprint is suppressed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying figures. Incidentally, the figures merely schematically show the constitutions and positional relationships of respective components to enable an understanding of the present invention. Although a preferred constitutional example of the present invention is explained below, the composition (material) of each constitution and the numerical conditions or the like are merely preferred examples. Thus, the present invention is by no means limited to the embodiments explained below. Incidentally, hatchings indicative of cross-sections and the like are partly omitted.

Figure 1A:
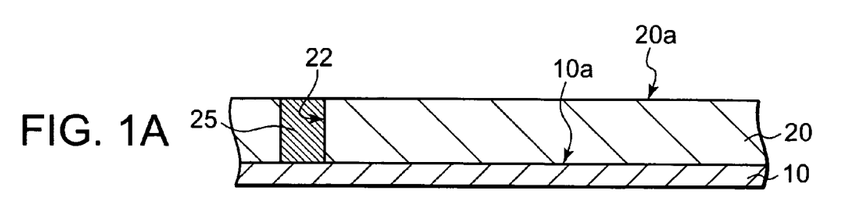
FIGS. 1A through 1D are respectively process diagrams (part 1) for describing a method for manufacturing a ferroelectric memory, according to the present invention.
Figure 1B:
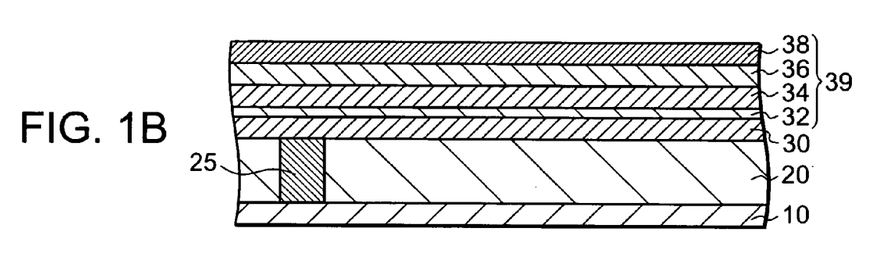
Figure 1C:
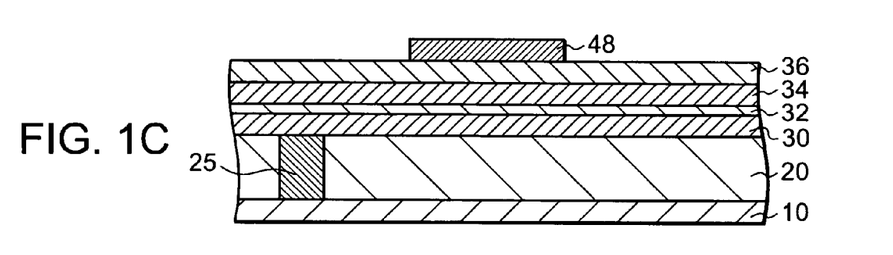
Figure 1D:
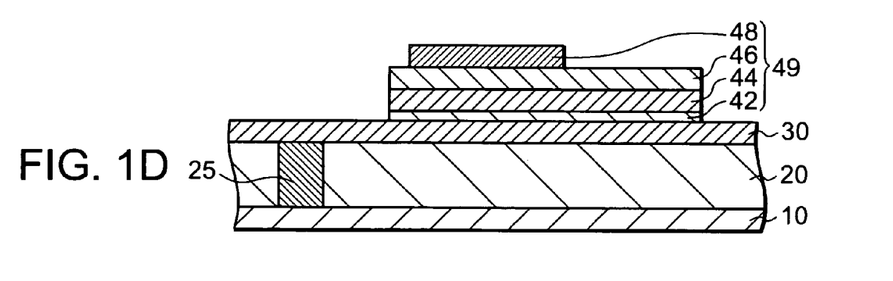
Figure 2A:
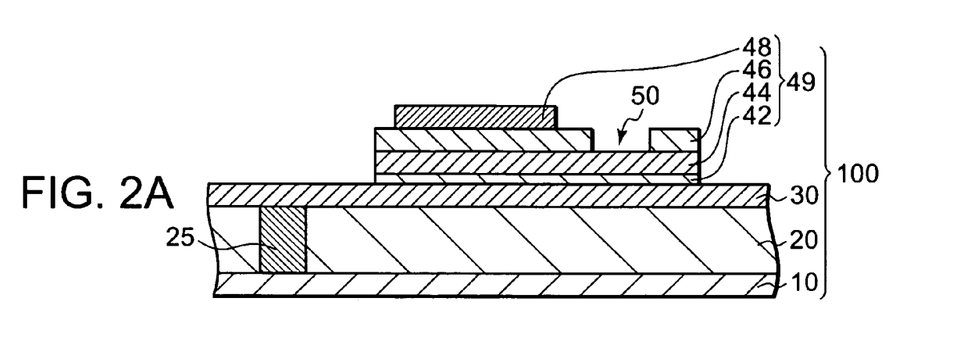
FIGS. 2A through 2C are respectively process diagrams (part 2) for describing the method for manufacturing the ferroelectric memory, according to the present invention.
Figure 2B:
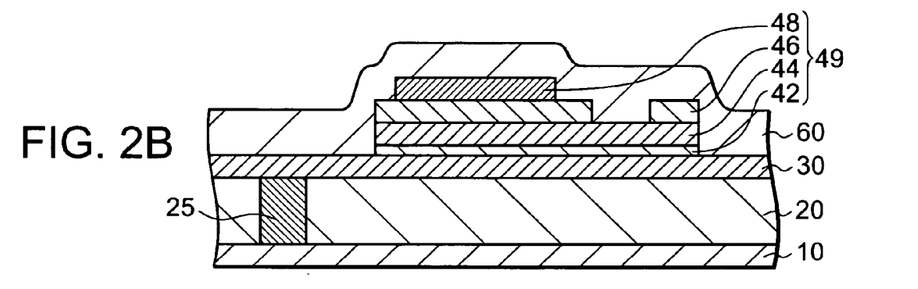
Figure 2C:
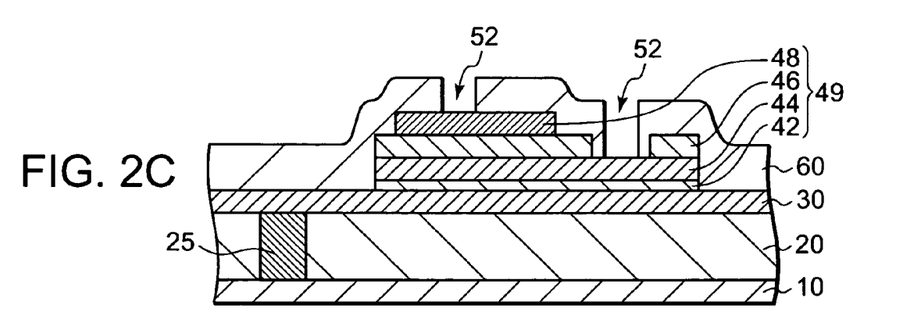
Figure 3A:
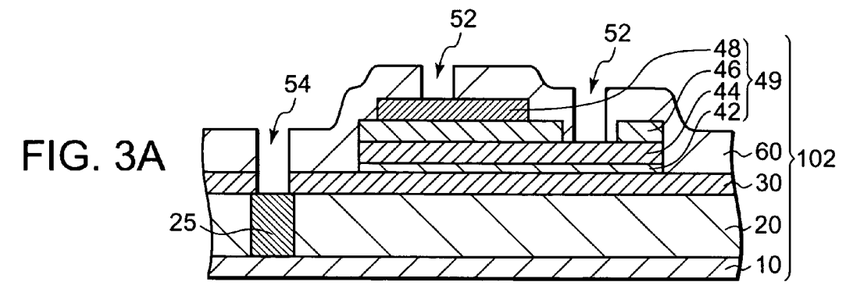
FIGS. 3A through 3C are respectively process diagrams (part 3) for describing the method for manufacturing the ferroelectric memory, according to the present invention.
Figure 3B:
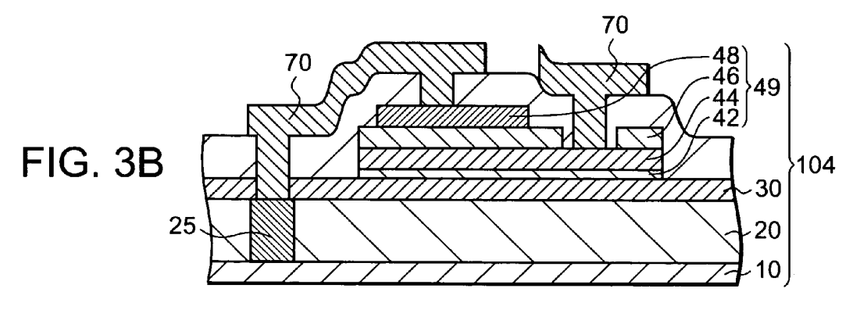
Figure 3C:
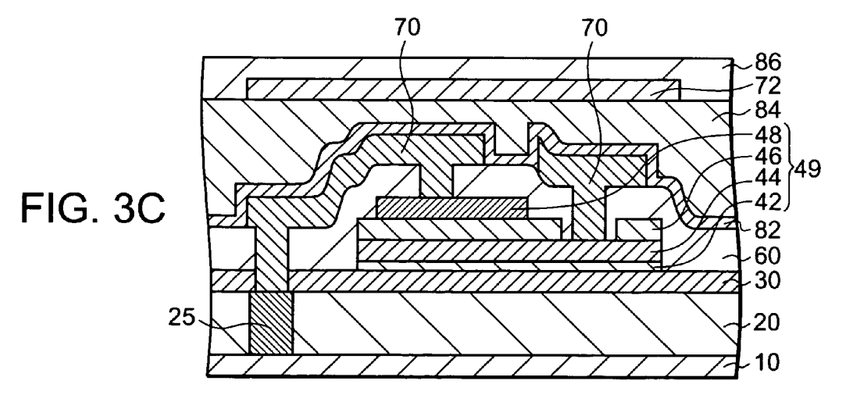

FIGS. 1 through 3 are respectively schematic diagrams for describing a method for manufacturing a ferroelectric memory, according to the present invention and are shown in the form of cut areas of cross-sections thereof.

A semiconductor substrate 10 formed with each MOSFET is first prepared. Next, a first interlayer insulating film 20 is deposited on one main surface 10a of the semiconductor substrate 10. The first interlayer insulating film 20 is subjected to photolithography and dry etching to define or provide a contact hole 22 for making contact with the gate, drain or source of the MOSFET. Tungsten or the like is embedded into the contact hole 22 to form a conductive plug 25. Thereafter, the surface 20a of the first interlayer insulating film 20 may preferably be planarized by, for example, a CMP (Chemical Mechanical Polishing) method (see FIG. 1A). Incidentally, the illustration of the MOSFET is omitted from the drawings and one conductive plug 25 is shown by way of example.

Next, an antioxidant film 30 is laminated on the first interlayer insulating film 20. Thereafter, an adhesive layer 32, a first conductor layer 34, a ferroelectric layer 36 and a second conductor layer 38 are stacked over the antioxidant film 30 in this order to form a capacitor forming laminated film 39. The antioxidant film 30 is formed by laminating a silicon oxide film and a silicon nitride film by an arbitrary and suitable known plasma CVD method, for example. Next, the adhesive layer 32 is formed on the antioxidant film 30 by sputtering tantalum oxide ($TaO_x$), for example. The adhesive layer 32 is a layer formed to cause the antioxidant film 30 and a lower electrode of a ferroelectric capacitor to be described later to adhere to each other and also serves as a bed or base layer for the lower electrode. The first conductor layer 34 is formed on the adhesive layer 32 by sputtering using platinum (Pt), for example. Further, the ferroelectric layer 36 is formed on the first conductor layer 34 by application based on the known spin coat and crystallization anneal using $SrBi_2Ta_2O_9$, for example. Subsequently, the second conductor layer 38 is formed on the ferroelectric layer 36 by sputtering using platinum (Pt), for example, in a manner similar to the first conductor layer 34 (see FIG. 1B).

Next, the second conductor layer 38 is processed by the arbitrary and suitable known photolithography and dry etching to form an upper electrode 48 (see FIG. 1C).

Further, the ferroelectric layer 36 and the first conductor layer 34 are sequentially processed by the arbitrary and suitable known photolithography and dry etching to form a ferroelectric thin film 46 and a lower electrode 44 respectively. This processing is performed under the same dry etching process. Thus, the lower electrode 44 is formed on a self-alignment basis with the ferroelectric thin film 46 as a mask. At this time, the adhesive layer 32 is also processed to result in a base layer 42 of the lower electrode 44. A ferroelectric capacitor 49 constituted of the upper electrode 48, ferroelectric thin film 46, lower electrode 44 and base layer 42 is obtained from the capacitor forming laminated film 39 in this way (see FIG. 1D).

Next, a first aperture or opening 50 for lower electrode contact is defined in the ferroelectric thin film 46 by the arbitrary and suitable known photolithography and dry etching in order to make contact with the lower electrode 44 (see FIG. 2A). The first opening 50 is formed in an area out of the upper electrode 48. Incidentally, a structure formed on the upper side of the semiconductor substrate 10 and having the first interlayer insulating film 20, the antioxidant film 30 and the ferroelectric capacitor 49 is shown as a first structure 100 in FIG. 2A.

Due to etching from the formation of the ferroelectric capacitor 49 to the process step for forming the first opening 50 in the ferroelectric thin film 46, part of the ferroelectric thin film 46 is degraded in its crystallinity. In order to recover the degraded crystallinity, first recovery anneal is effected on the ferroelectric thin film 46. In the present constitutional example, thermal treatment equivalent to the crystallization anneal of a ferroelectric is suitable for the first recovery anneal. In the present example, preferably, the first structure 100 shown in FIG. 2A is heat-treated at 750° C. for 30 minutes in an oxygen atmosphere.

Next, a second interlayer insulating film 60 is formed over the upper whole surface of the antioxidant film 30 so as to bury the ferroelectric capacitor 49. The second interlayer insulating film 60 is formed of a silicon oxide film by, for example, a plasma CVD (Chemical Vapor Deposition) method using TEOS (TetraEthylOrthoSilicate) (see FIG. 2B).

Next, second apertures or openings 52 for contact are respectively formed in the second interlayer insulating film 60 by photolithography and dry etching to electrically connect the upper electrode 48 and lower electrode 44 of the ferroelectric capacitor 49 and an external circuit of the ferroelectric memory (see FIG. 2C).

Next, second recovery anneal is effected on the ferroelectric thin film 46 to recover the crystallinity of the ferroelectric thin film 46 from damage suffered upon formation of the second interlayer insulating film 60 and the second openings 52.

After the second recovery anneal, a third aperture or opening 54 is formed in the second interlayer insulating film 60 and the antioxidant film 30 by photolithography and etching to electrically connect the conductive plug 25 and the external circuit of the ferroelectric memory (see FIG. 3A). Incidentally, a structure having the first structure 100 and the second interlayer insulating film 60 formed with the second openings 52 and the third opening 54 is shown as a second structure 102 in FIG. 3A. Since tungsten is exposed with the formation of the third opening 54, thermal treatment at a high temperature in the oxygen atmosphere cannot be carried out subsequently.

Next, a metal layer (not shown) is formed within the second and third openings 52 and 54 and over the second interlayer insulating film 60. Thereafter, the metal layer is processed by photolithography and etching to form a first metal wiring 70 (see FIG. 3B). Incidentally, a structure provided with the second structure 102 and the first metal wiring 70 is shown as a third structure 104 in FIG. 3B.

After the formation of the first metal wiring 70, the third structure 104 is heat-treated at a temperature ranging from 350° C. to 450° C. for 30 minutes in the oxygen atmosphere. This thermal treatment makes it possible to recover degeneration of crystal that the ferroelectric thin film 46 has suffered in a process step from the execution of the second recovery anneal to the formation of the first metal wiring 70.

Figure 4:
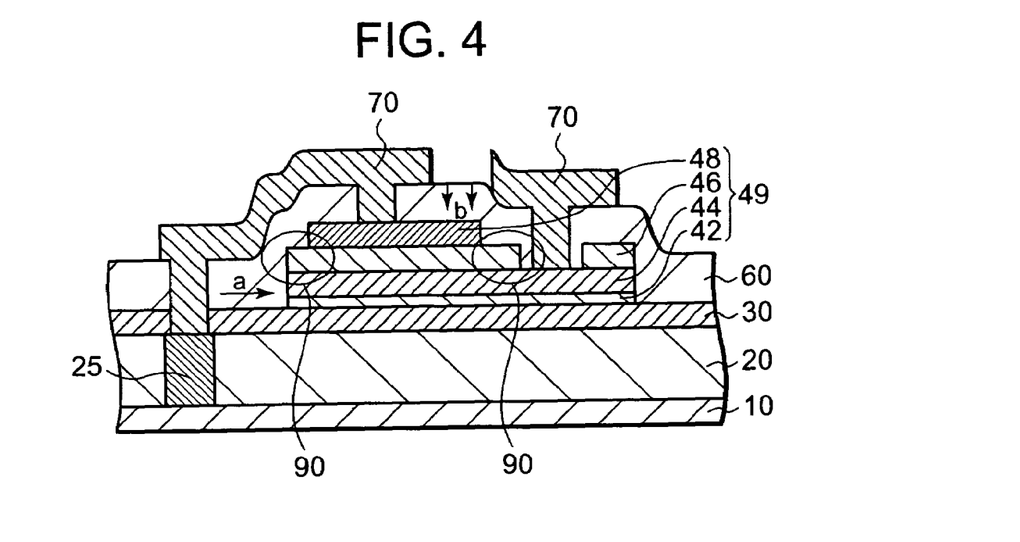
FIG. 4 is a diagram for describing damage introduced subsequently to a process step for forming a ferroelectric capacitor.

Damage that occurs in the ferroelectric thin film 46 after the second recovery anneal will be explained with reference to FIG. 4. FIG. 4 is a diagram for describing damage species introduced after the step for forming the ferroelectric capacitor. The damage species for causing damage are introduced in the step for forming the third opening 54 described with reference to FIG. 3A and upon formation of the first metal wiring 70 described with reference to FIG. 3B.

In the step for forming the third opening 54, a hydrogen gas ($H_2$) generated at ashing and water ($H_2O$) used upon cleaning are introduced into the second interlayer insulating film 60 through a path indicated by arrow a in FIG. 4, for example, as the damage species. Subsequently to the step for forming the first metal wiring 70, $H_2$ and $H_2O$ or the like reach the neighborhood (neighborhood surrounded by each ellipsoid designated at numeral 90 in FIG. 4) of the side walls of the ferroelectric capacitor, particularly, the ferroelectric thin film 60 by a heat load under which the second interlayer insulating film 60 is put, thus resulting in the occurrence of crystal degeneration that causes an imprint.

In the step for forming the first metal wiring 70, a chloride gas ($Cl_2$) generated due to an etching gas, or a hydrogen gas ($H_2$) generated at ashing and a fluorine gas ($F_2$), and water ($H_2O$) used upon cleaning are introduced into the second interlayer insulating film 60 through a path indicated by arrows b in FIG. 4, for example, as damage species. These $H_2$, $F_2$, $Cl_2$ and $H_2O$ reach the neighborhood of the side walls of the ferroelectric thin film 46 in a manner similar to $H_2$ and $H_2O$ introduced in the step for forming the third opening 54, thus resulting in crystal degeneration that causes an imprint.

In the present example, immediately after the formation of the first metal wiring 70, thermal treatment is done in the oxygen atmosphere at 350° C. to 450° C. corresponding to temperatures of such a degree as not to influence the first metal wiring 70 formed of aluminum. With such thermal treatment, the damage species such as $H_2$, $F_2$, $Cl_2$ and $H_2O$ or the like are released from the second interlayer insulating film 60. Accordingly, the damage species that reach the ferroelectric thin film 46 due to the thermal load to which the second interlayer insulating film 60 is subjected subsequently to the step for forming the first metal wiring 70, are reduced drastically so that degradation due to an imprint is suppressed.

Figure 5:
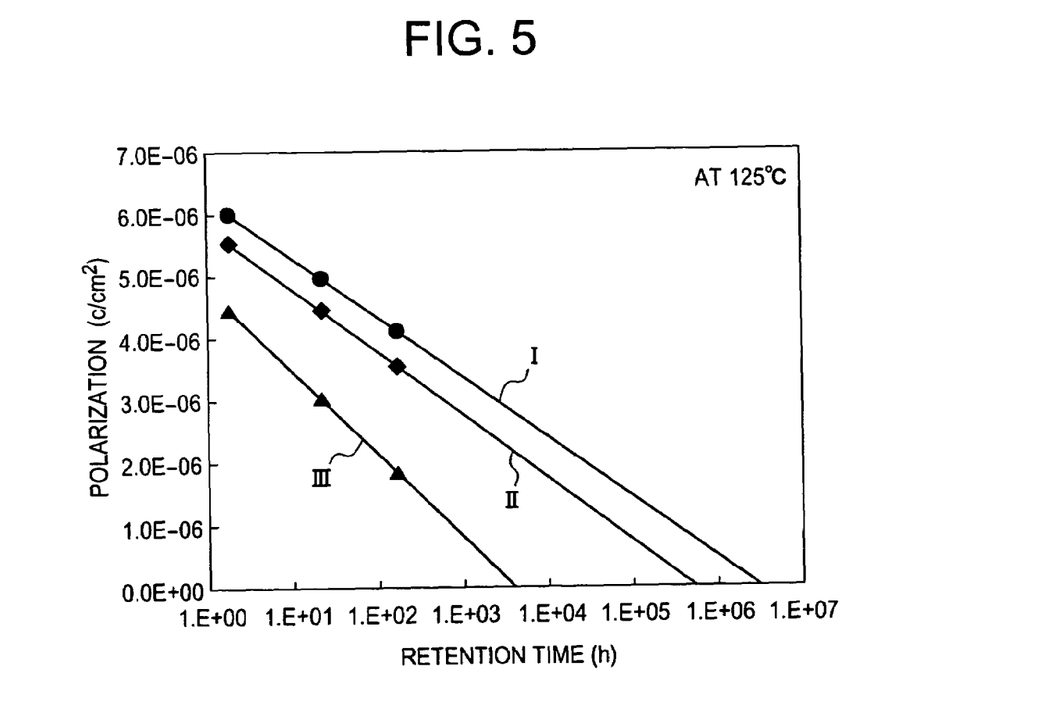
FIG. 5 is a diagram for describing the effect of thermal treatment.
Figure 6:
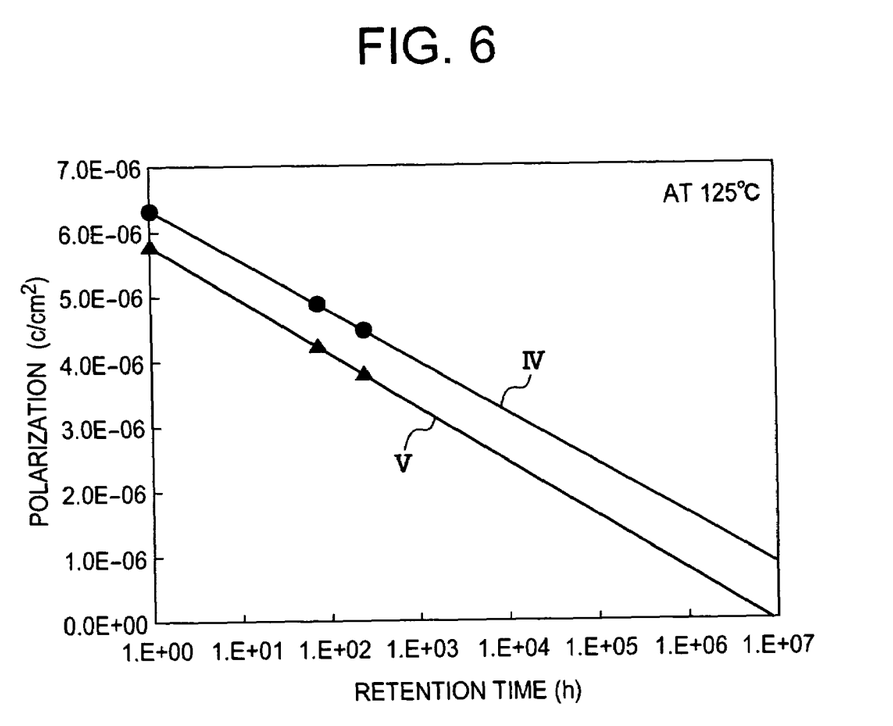
FIG. 6 is a diagram for describing the effect of thermal treatment.

The effect of this thermal treatment will be explained with reference to FIGS. 5 and 6. FIGS. 5 and 6 are respectively diagrams for describing the effect of the thermal treatment. FIG. 5 shows a difference in degradation of the ferroelectric capacitor due to the difference between atmospheres at the execution of anneal. FIG. 6 shows a difference in degradation of the ferroelectric capacitor due to the difference between temperatures at the execution of anneal.

The horizontal axis of FIG. 5 indicates a high temperature holding or retention time, and the vertical axis thereof indicates the capacity of polarization of the ferroelectric thin film at the time that it is polarized in the direction opposite to the direction of polarization of the ferroelectric thin film at the high-temperature retention. A straight line I indicates the capacity of polarization of the ferroelectric capacitor where thermal treatment is done in an oxygen atmosphere, a straight line II indicates the capacity of polarization of the ferroelectric capacitor where thermal treatment is done in a nitrogen atmosphere, and a straight line III indicates the capacity of polarization of the ferroelectric capacitor where no thermal treatment is done, respectively.

With the thermal treatment in the oxygen atmosphere (straight line I) and the nitrogen atmosphere (straight line II), the slope or gradient of each straight line, i.e., the amount of change in the capacity of polarization with respect to the holding time is reduced as compared with the case in which no thermal treatment is done (straight line III). This shows that the amount of damage species attained to the ferroelectric thin film has been reduced by the thermal treatment in the oxygen atmosphere (straight line I) or the nitrogen atmosphere (straight line II). This indicates that the thermal treatment in the nitrogen atmosphere and the thermal treatment in the oxygen atmosphere obtain the releasing effect of similar damage species.

Where the thermal treatment in the oxygen atmosphere is done (straight line I), the amount of change in the capacity of polarization is small as shown in FIG. 5 as compared with the case in which the thermal treatment in the nitrogen atmosphere is done (straight line II). The effect of compensating for crystal damaged spots by oxygen is obtained in addition to the above releasing effect in the case of the thermal treatment in the oxygen atmosphere. Therefore, it shows that imprint degradation is reduced as compared with the case in which the thermal treatment in the nitrogen atmosphere is done.

The horizontal axis of FIG. 6 indicates a high temperature holding or retention time, and the vertical axis thereof indicates the capacity of polarization of the ferroelectric thin film at the time that it is polarized in the direction opposite to the direction of polarization of the ferroelectric thin film at the high-temperature retention. A straight line IV indicates the capacity of polarization of the ferroelectric capacitor where thermal treatment is done in an oxygen atmosphere at 400° C., and a straight line V indicates the capacity of polarization of the ferroelectric capacitor where thermal treatment is done in an oxygen atmosphere at 350° C.

As shown in FIG. 6, both of changes in the polarized capacity where the thermal treatment in the oxygen atmosphere at 400° C. is performed (straight line IV) and/or the thermal treatment in the oxygen atmosphere at 350° C. is done (straight line V) are small as compared with the case in which no thermal treatment is done (straight line III in FIG. 5). Where the thermal treatment in the oxygen atmosphere at 400° C. is done (straight line IV), a change in the capacity of polarization is small as compared with the case in which the thermal treatment in the oxygen atmosphere at 350° C. is done (straight line V). Thus, if the temperature for thermal treatment is made high, then the change in the capacity of polarization becomes small, i.e., the effect of the thermal treatment is enhanced. However, the upper limit of the temperature for thermal treatment is defined in terms of a heat-resistant temperature for each of an aluminum wiring and exposed tungsten used in a conductive plug. The heat-resistant temperature for these is about 500° C. Accordingly, the atmospheric temperature at thermal treatment may be a high temperature within the range not exceeding 500° C., preferably, over 350° C. to under 450° C.

Although a description has been made here of the example in which the third structure 104 is heat-treated after the step for forming the first metal wiring described with reference to FIG. 3B, the second structure 102 may be heat-treated after the step for forming the third opening 54 described with reference to FIG. 3A and prior to the step for forming the first metal wiring 70 described with reference to FIG. 3B.

Heat-treating the second structure 102 prior to the step for forming the first metal wiring 70 makes it possible to effectively remove the damage species in the step up to the formation of the third opening 54.

Further, the thermal treatment may be done twice by effecting first thermal treatment on the second structure 102 after the step for forming the third opening 54 and before the step for forming the first metal wiring 70 and effecting second thermal treatment on the third structure 104 after the step for forming the first metal wiring 70. When the twice-thermal treatment corresponding to the first thermal treatment and the second thermal treatment is done, the damage species respectively introduced in the step for forming the third opening 54 and the step for forming the first metal wiring 70 are individually removed. Thus, the larger effect of suppressing imprint degradation can be expected as compared with the case in which one thermal treatment is done.

After the above thermal treatment, a silicon nitride (SiN) film 82 is formed on the second interlayer insulting film 60 and the first metal wiring 70 by arbitrary and suitable known sputtering. The SiN film 82 is provided to prevent water ($H_2O$) produced in the step of forming a third interlayer insulating film 84 to be described later from penetrating into the ferroelectric thin film 46. The third interlayer insulating film 84 is formed on the SiN film 82 by, for example, the known plasma CVD using TEOS, with a silicon oxide film. Further, a metal layer (not shown) is formed on the third interlayer insulating film 84 and thereafter processed by photolithography and etching to form a second metal wiring 72. A silicon nitride film is deposited so as to cover the second metal wiring 72 by arbitrary and suitable known sputtering and thereby formed as a passivation film 86 (see FIG. 3C).

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A method for manufacturing a ferroelectric memory, comprising:

preparing a semiconductor substrate formed with a MOSFET;

depositing a first interlayer insulating film on the semiconductor substrate;

forming a conductive plug in the first interlayer insulating film, the conductive plug being in electrical contact with the MOSFET;

sequentially laminating a first conductor layer, a ferroelectric layer and a second conductor layer over the first interlayer insulating film to form a capacitor forming laminated film;

processing the second conductor layer to form an upper electrode and sequentially processing the ferroelectric layer and the first conductor layer to form a ferroelectric thin film and a lower electrode respectively, thereby forming a ferroelectric capacitor from the capacitor forming laminated film;

forming a second interlayer insulating film on a first structure provided with the semiconductor substrate, the first interlayer insulating film and the ferroelectric capacitor so as to embed the ferroelectric capacitor therein;

forming, in the second interlayer insulating film, openings that expose the conductive plug and the ferroelectric capacitor for electrical connection with an external circuit of the ferroelectric memory, to form a second structure;

forming a metal wiring on the second interlayer insulating film of the second structure and in the openings to form a third structure, the metal wiring electrically connecting the conductive plug, the ferroelectric capacitor and the external circuit; and thermally treating the third structure in an oxygen atmosphere from over 350° C. to under 450° C.

2. A method for manufacturing a ferroelectric memory, comprising:

preparing a semiconductor substrate formed with a MOSFET;

depositing a first interlayer insulating film on the semiconductor substrate;

forming a conductive plug in the first interlayer insulating film, the conductive plug being in electrical contact with the MOSFET;

sequentially laminating a first conductor layer, a ferroelectric layer and a second conductor layer over the first interlayer insulating film to form a capacitor forming laminated film;

processing the second conductor layer to form an upper electrode and sequentially processing the ferroelectric layer and the first conductor layer to form a ferroelectric thin film and a lower electrode respectively, thereby forming a ferroelectric capacitor from the capacitor forming laminated film;

forming a second interlayer insulating film on a first structure provided with the semiconductor substrate, the first interlayer insulating film and the ferroelectric capacitor so as to embed the ferroelectric capacitor therein;

forming, in the second interlayer insulating film, openings that expose the conductive plug and the ferroelectric capacitor for electrical connection with an external circuit of the ferroelectric memory, to form a second structure;

thermally treating the second structure in an oxygen atmosphere from over 350° C. to under 450° C.; and forming a metal wiring on the second interlayer insulating film of the second structure and in the openings to form a third structure.

3. A method for manufacturing a ferroelectric memory, comprising:

preparing a semiconductor substrate formed with a MOSFET;

depositing a first interlayer insulating film on the semiconductor substrate;

forming a conductive plug in the first interlayer insulating film, the conductive plug being in electrical contact with the MOSFET;

sequentially laminating a first conductor layer, a ferroelectric layer and a second conductor layer over the first interlayer insulating film to form a capacitor forming laminated film;

processing the second conductor layer to form an upper electrode and sequentially processing the ferroelectric layer and the first conductor layer to form a ferroelectric thin film and a lower electrode respectively, thereby forming a ferroelectric capacitor from the capacitor forming laminated film;

forming a second interlayer insulating film on a first structure provided with the semiconductor substrate, the first interlayer insulating film and the ferroelectric capacitor so as to embed the ferroelectric capacitor therein;

forming, in the second interlayer insulating film, openings that expose the conductive plug and the ferroelectric capacitor for electrical connection with an external circuit of the ferroelectric memory, to form a second structure;

effecting a first thermal treatment on the second structure in an oxygen atmosphere from over 350° C. to under 450° C.;

forming a metal wiring on the second interlayer insulating film of the second structure and in the openings to form a third structure; and effecting a second thermal treatment on the third structure in an oxygen atmosphere from over 350° C. to under 450° C.

* * * * *